United States Patent [19]

Leibenzeder et al.

[11] 4,287,848

[45] Sep. 8, 1981

[54] APPARATUS FOR THE MANUFACTURE OF EPITAXIAL $Ga_{1-x}Al_xAs$:Si FILM

[75] Inventors: Siegfried Leibenzeder, Erlangen; Christine Heindl, Mantel, both of Fed. Rep. of Germany

[73] Assignee: Siemens Aktiengesellschaft, Berlin & Munich, Fed. Rep. of Germany

[21] Appl. No.: 84,155

[22] Filed: Oct. 12, 1979

[30] Foreign Application Priority Data

Oct. 28, 1978 [DE] Fed. Rep. of Germany ....... 2847091

[51] Int. Cl.³ .............................................. B05C 5/00
[52] U.S. Cl. .................................... 118/401; 118/415; 118/421
[58] Field of Search .................... 156/621, 622, 624; 118/401, 421, 415, 416, 429; 148/171, 172

[56] References Cited

U.S. PATENT DOCUMENTS

| | | | |
|---|---|---|---|
| 3,759,759 | 9/1973 | Solomon | 156/622 X |
| 3,762,367 | 10/1973 | Nishizawa et al. | 156/622 X |
| 3,933,123 | 1/1976 | Andre | 156/622 X |

*Primary Examiner*—John P. McIntosh
*Attorney, Agent, or Firm*—Kenyon & Kenyon

[57] ABSTRACT

Apparatus for manufacturing epitaxial $Ga_{1-x}Al_xAs$:Si films via liquid-phase epitaxy, using a boat in a quartz tube. The Ga, which is contained in a graphite boat, open at the long side, is baked out first. The Ga-melt is allowed to run onto GaAs substrate wafers, on which Si is deposited, and to be drawn into the gap between the GaAs-substrate wafers and the plane graphite surfaces. The thin Ga-melt formed above the GaAs substrate wafers is then brought into contact with the melted Al and is allowed to cool.

3 Claims, 6 Drawing Figures

APPARATUS FOR THE MANUFACTURE OF EPITAXIAL $Ga_{1-x}Al_xAs:Si$ FILM

BACKGROUND OF THE INVENTION

Light-emitting diodes are a permanent component in modern electronics. They permit minaturization and, due to their excellent mechanical stability, low operating temperature, long life and compatibility with semiconductor circuits, find application, for example, as indicator lamps, displays, infrared emitters, opto-couplers and infrared light gates. Luminescent diodes are divided into two classes, i.e., those which emit in the visible spectral range and those which emit in the infrared spectral range.

For luminescence in the visible spectral range, the Group III-V compounds GaP and $GaAs_{1-x}P_x$ mixed crystals have become particularly important. Depending upon the composition and the doping, wavelengths between red and yellow-green (690 to 570 nm) can be adjusted.

$Ga_{1-x}Al_xAs$ mixed crystals can be used in the infrared spectral range below 900 nm and as red light diodes in the visible spectral range (J.Appl.Phys. 48 (1977), pages 2485 to 2492). They make it possible to adjust any desired wavelength of the light emission between 650 and 900 nm. Besides GaAs, $Ga_{1-x}Al_xAs:Si$ mixed crystals can be used to advantage for red emission as well as for luminescence in the infrared spectral range.

The preparation of epitaxial $Ga_{1-x}Al_xAs$ films via the liquid-phase epitaxy is known (J.Appl.Phys. 48 (1977), pages 2485 to 2492). The layer growth is accomplished by cooling a Ga, Al melt which is in contact with a GaAs substrate and is saturated with As, starting from a constant temperature. The p-n junction required for the construction of luminescent diodes is prepared during the growth of an epitaxial layer via incorporation of the doping substance Si. Due to the incorporation of the Si atoms in Ga-lattice locations (which predominates at higher temperatures), the n-conduction layer grows first. The p-conduction layer then follows due to the predominant incorporation of the Si atoms in As-lattice locations at lower temperatures. By varying the mol content x AlAs in the mixed crystal $Ga_{1x}Al_xAs$, the energy bandwith, and thereby, the wavelength of the light emission, is changed.

In these methods, so-called push boats of graphite are used to receive the Ga, Al, As-melts as well as the GaAs-substrate wafers to be coated (J.Appl.Phys. 48 (1977), page 2485, particularly FIG. 3). Besides the extremely complicated construction of the known push boats, the capacity of substrate area to be coated per coating operation is low. It is thus necessary to use single-crystal substrate wafers of uniform geometry. Because of the thickness of Ga melts which are specifically related to the use of boats, the homogenizing times are several hours.

SUMMARY OF THE INVENTION

It is an object of the invention to describe a method and apparatus for the manufacture of epitaxial $Ga_{1-x}Al_xAs:Si$ films, by means of which it is posible to obtain a larger capacity of substrate areas to be coated per coating operation by the liquid-phase epitaxy process, using graphite boats with little waste of single-crystal substrate wafers and considerably shorter homogenizing times.

To solve this problem, the Ga melts which are contained in a quartz tube in a graphite boat open on one side, are first baked out at a temperature below the melting point of Al and is allowed to run at elevated temperature onto GaAs-substrate wafers of non-uniform geometry, on which Si is deposited, using the capillary effect. The thin Ga melt formed is then allowed to be drawn into the gap between the GaAs-substrate wafers and the plane graphite surfaces of the boat. The remaining Ga excess is thereupon brought into contact with the melted Al, and the Ga melt thus formed, in which Al is dissolved and which is saturated with As via substrate separation, is allowed to cool in contact with the GaAs-substrate wafers. The saturation of the melt with As via separation of the GaAs substrate provides surfaces suitable for epitaxy without wetting deficiencies. The quartz tube can be inclined 1° to 10°, preferably 5°, to the horizontal. The epitaxial $Ga_{1-x}Al_xAs:Si$ films obtained are single-crystal with reference to the crystallographic orientation of the substrate crystals. They can be obtained with differing thickness between 20 and 300 um.

The Al can be introduced via a dosing unit into the Ga-melt, and the boat can be pushed onto a stopping tube via a quartz carrier.

According to a particularly advantageous procedure, the Ga/Al melt can be made to run onto the GaAs substrate to be coated by rotating the moving tube 180°. The rotation can preferably be accomplished by means of a quartz tube carrier which is flattened on one side and in which the boat is contained.

The advantage of the method according to the invention is in particular that GaAs substrate wafers of any desired geometry, i.e., shape and size, can be used. The method can be implemented without mechanical axial motion of the partial melts, i.e., without moving the individual boat or boats. If a slider is used in a boat according to the invention, the former can be moved more easily and serves as the Al-dosing unit. In particular, a higher capacity of substrate area to be coated per coating operation is achieved, i.e., 500 $cm^2$ as against 60 to 70 $cm^2$.

The method according to the invention thus has the advantage of making the manufacture of epitaxial $Ga_{1-x}Al_xAs:Si$ films more economical by a method which, from a manufacturing point of view, is simpler.

The subject of the invention is further an apparatus for implementing the method characterized above. With reference to FIGS. 1 and 3, the apparatus is characterized by stackable boats of graphite with graphite plates 1, 40 having open longitudinal sides 6, 42 for receiving the Ga 9, 47, the GaAs substrate wafers 8, 46 of any desired geometry with Si 12, 48 on the horizontal or slightly inclined flat surface 4, 43 and depressions 7 in the flat surface 4 or movable holes 50 in the part 45 which can be shifted axially via the graphite parts 40 and 44 with the holes 49, for receiving the Al, 11, 51.

With reference to FIG. 5 another advantageous embodiment of an apparatus according to the invention is characterized by stackable boats of graphite with the graphite plate 22 having stepped holes; the lower hole 24 with Al and Si 25, completely covered by a GaAs wafer fragment 26; the upper hole 23 containing Ga 27 with the GaAs-substrate wafer 28 to be coated, which is supported in places.

The epitaxial $Ga_{1-x}Al_xAs$ films prepared by the method according to the invention, doped with Si, can be used in the visible wavelength range for fabricating red displays, in the IR range for fabricating opto-couplers, light gates, for transmitting audio and for remote-control methods.

BRIEF DESCRIPTION OF THE DRAWINGS

In the drawings, apparatus for implementing the method according to the invention is shown.

DETAILED DESCRIPTION OF THE INVENTION

Figure 1:
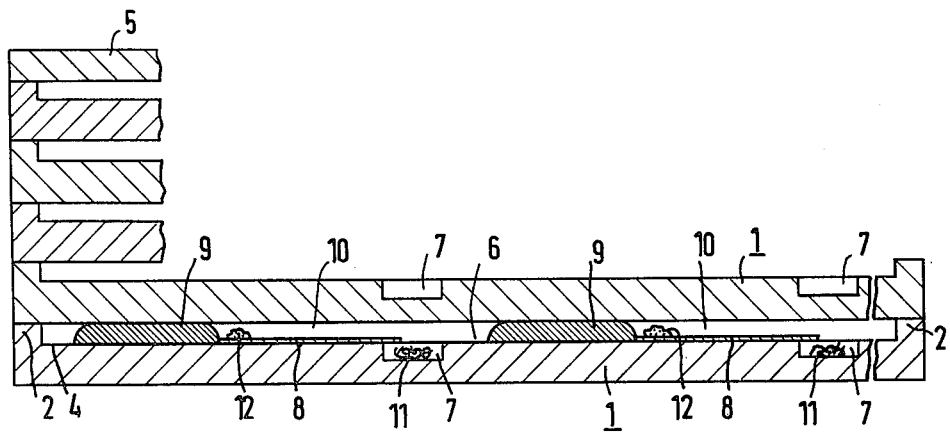
FIGS. 1, 3 and 5 show longitudinal cross sections through boats according to the invention.

According to FIG. 1, the device can consist of a graphite plate 1, which has on the narow sides a rim 2, which is elevated by 1 to 5 mm and preferably by 3 mm over the flat surface 4. The planar graphite plates have the dimensions 70×6×1 cm. By stacking another plate 1 or putting on a cover plate 5, open lengthwise sides 6 are produced. The plates 1 have cylindrical depressions at uniform spacings. The GaAs-substrate wafers 8 to be coated are arranged on the flat surface 4 so that they extend over the edge of the depressions 7. On the other side of the wafer, the amount of Ga required for the epitaxy is arranged, touching the edge of the wafer and doped in such a manner that, with a substrate thickness of, for example, 600 um, it fills the gap 10 produced by virtue of a further plate 1 or the cover plate 5 and the surface of the substrate wafer, of for example, 2.4 mm. An excess of Ga runs into the depression 7 in which the Al 11 is contained, for example, in the form of wire. The Si 12 required for the doping is deposited on the GaAs substrate wafers 8. The parts can be stacked.

With an average area of the individual substrate wafers 8 of 12 cm$^2$, 1.5 cm$^2$ of substrate can then be coated per cm of boat length, i.e., about 100 cm$^2$ for a boat length 70 cm. If five graphite plates 1 and a cover plate 5 are used, the boat capacity can be expanded to about 500 cm$^2$ of substrate area.

Figure 2:
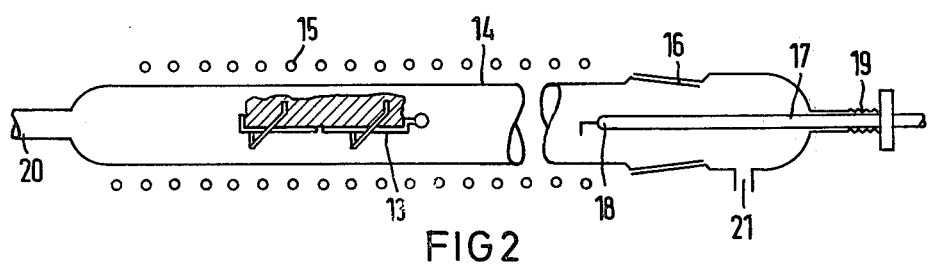
FIGS. 2 and 4 show longitudinal cross sections through a quartz tube with a perspective view of the boat carrier.

According to FIG. 2, a boat with five stories, the cross section of which is about 6×6 cm$^2$, can be arranged on a quartz carrier 13. It is pushed into the quartz tube 14 with an inside diameter of about 95 mm which is surrounded by a resistance-heated furnace 15, via the ground joint 16 by means of the guide tube 17. The guide tube 17 with the sealed end 18 is fixed above the push boat by means of the vacuum-tight squeezed screw connection 19. A thermocouple is inserted into 17 for recording the temperature during the liquid-phase epitaxy. The procedure takes place in a H$_2$-atmosphere. The gas inlet is designated with 20 and the gas outlet with 21.

At a temperature of about 600° C., the Ga 9 in a thin layer is baked out. The volatile gas Ga$_2$O, produced by the reaction

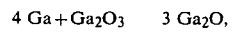

can escape at the long side of the boat and is transported away by the H$_2$-gas. At temperatures above 650° C., Ga microdroplets are deposited on the substrate surface and at the same time, Ga 9 is drawn into the gap 10 and coats the substrate wafers 8, the Si 12 deposited there then being dissolved. If the substrate wafer overflows, the excess Ga gets into the depression 7 and dissolves the Al 11. The spreading of the Ga comes to a standstill. The temperature is increased up to the starting temperature of the epitaxy. The Ga-melt is saturated with As by partial separation of the substrate and the Al is dissolved homogeneously in the Ga-melt. By programmed lowering of the temperature, the film grows on the remaining substrate (approx. 250 um thick). The melted Ga can be assisted in running into the gap 10 by an inclination of the quartz tube 14 by 1° to 10° and preferably, 5°.

Figure 3:
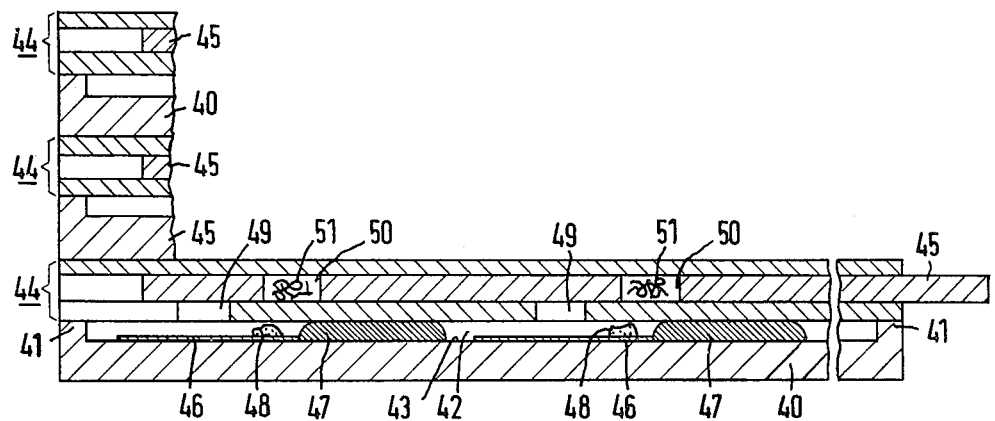

According to a second advantageous embodiment, the boat in FIG. 3 consists of a flat graphite part 40 which has on the narrow sides 41 a rim which is raised 1 to 5 mm and preferably 3 mm above the flat surface 43, and of the graphite part 44, in which a graphite part 45 can be moved axially. The flat graphite part 40 has the dimensions 70×6×1 cm. On the flat surface 43 of the graphite part 40, the GaAs-substrate to be coated 46 is arranged, the wafer edge of which is touched by the Ga 47. On the GaAs substrate wafers 46, there is Si 48. After the graphite part 44 is put in place, the gap 42 comes about, which is necessary for the epitaxial process and is 2.4 mm for a substrate thickness of about 600 um. The graphite part 44 has cylindrical holes 49 with a diameter of 10 mm, which are arranged at uniform spacings above the GaAs-substrate wafers. The graphite part 45, which is axially movable in the graphite part 44, likewise has cylindrical holes 50, in which the Al 51 is contained. The holes 50 have the same diameter and the same spacings as those in the graphite part 44. The parts 40 and 44 of the device can be stacked.

In a stack of three units, with a stack cross section of 6×6 cm$^2$, the boat capacity is 400 to 500 cm$^2$ of GaAs substrate area to be coated.

Figure 4:
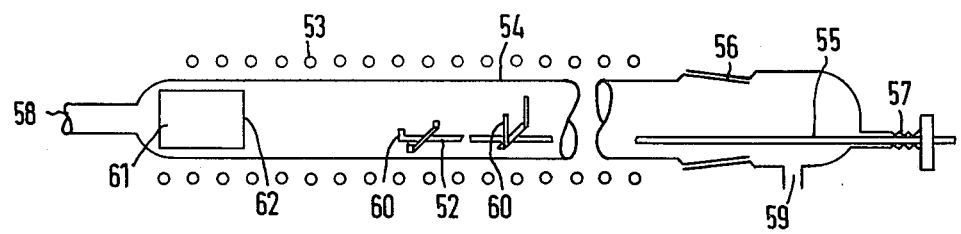

FIG. 4 shows a quartz tube 54 for receiving a stack boat according to the invention. The stack boat is inserted into the quartz tube 54, which is surrounded by a resistance-heated furnace 53, on the quartz carrier 52 by means of the guide tube 55 via the ground joint 56 and the guide tube 55 is fixed via the teflon-quartz squeezed screw connection 57.

The H$_2$-inlet is designated with 58 and the H$_2$-outlet with 59. The holding rods 60 of the quartz carrier 52 prevent axial displacement relative to the quartz carrier.

After Ga 47 is heated to about 600° C., whereby the Ga$_2$O formed escapes at the long sides of the boat and is carried away by the H$_2$-stream, it is drawn into the gap formed between the substrate 46 and the graphite part 44 if the temperature is raised further, and dissolves the Si. At the same time, the saturation of the Ga-melt begins by separation of GaAs from the GaAs-substrate wafers 46. At a temperature of 750° to 800° C., the movable doping unit 45, in the hole 50 of which the Al 51 is contained, is moved axially in such a manner that the holes 49 and 50 are on top of each other; the Al melt then receives the Ga, As melt located above the substrates and is dissolved there. The axial movement can be obtained by pushing the stack boat with the movable parts 45 protruding beyond the end face by means of the guide tube 55 onto the quartz rods fused-in at 62 in the quartz stopping tube 61.

After the temperature and solution equilibrium occurs at a temperature of 900° C., the mixed crystals are then deposited on the substrate that remains after the melt is saturated.

Figure 5:
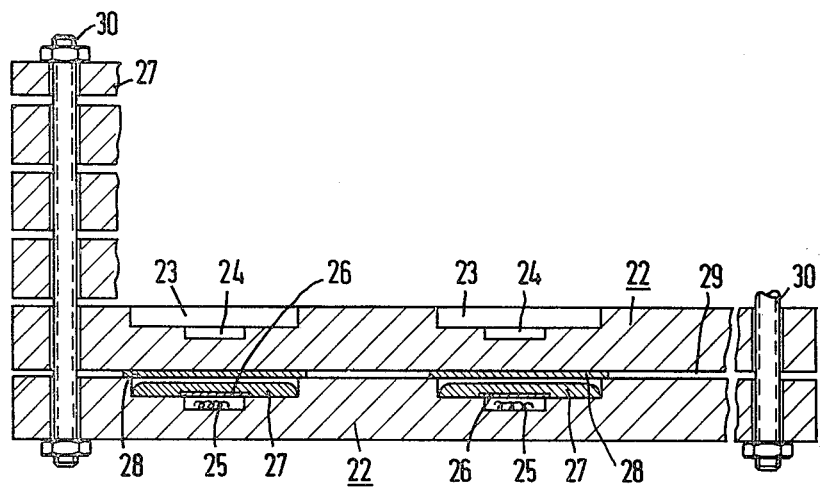

According to a third advantageous embodiment of the invention shown in FIG. 5, the graphite plates of the boat have the same dimensions with the exception of the upper graphite plate. In the lower flat part of 22, cylindrical holes 23 with a depth of 1 to 5 and preferably 3 mm, are arranged at uniform spacings, the size of which must be matched approximately to the dimensions of the substrate wafers to be used. At the center of the hole 23, there is always another lower cylindrical hole 24, 2 to 5 mm and preferably 3 mm deep with a diameter of 5 to 15 mm and preferably 10 mm. In this lower hole 24 are always contained Al and Si, for example, in wire form. The hole 24 is always covered completely by a GaAs wafer fragment 26. The Ga 27 is always contained in the upper hole 23, which is now separated from the respective lower hole 24 by the wafer fragment 26. Above the upper hole 23, the GaAs substrate wafer 28 to be coated is arranged, which is supported at the rim of the upper hole 23 point-wise. The substrate wafers 28 are secured in their position by an upper graphite plate in the case of a single-story boat or by respective flat parts 22 in the case of a stack. Between the plates 22 in the case of the stack boat or between the graphite plate 22 and an upper graphite plate in the case of a single-story boat, a gap 29 is produced, the height of which depends on the thickness of the substrate wafers 28 used. The device can be stacked and the stack is held together by means of the graphite bolts 30.

In a stack of 5 graphite plates, the boat capacity is about 500 cm$^2$ of substrate area to be coated per epitaxy run.

Figure 6:
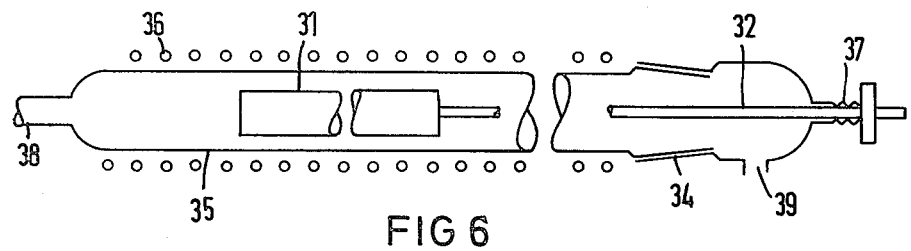
FIG. 6 shows a further quartz tube in a longitudinal cross section.

According to FIG. 6, the stack boat is inserted into the tubular boat carrier 31. The latter consists of a quartz tube closed on one side, to which on the closed side the moving tube 32 is fused, which serves at the same time for receiving a thermocouple for monitoring the process. A flat at the boat carrier 31 prevents the boat from rotating in the boat carrier 31, which has been found to be particularly advantageous. Via the ground joint 34, the boat unit is inserted into the quartz tube 35, which is surrounded by a resistance-heated furnace 36. The moving tube 32 is fixed by means of a vacuum-tight teflon-quartz squeezed screw connection 37. The H$_2$ gas inlet is designated with 38 and the H$_2$-gas outlet with 39.

At 600°, the Ga 27 can be baked out separately from the Al+Si 25. The Ga$_2$O produced escapes through the gap 29 and is carried away by the H$_2$-gas. The temperature is increased up to the starting temperature for the epitaxy, which is between 880° and 950° C. In the process, the small amount of GaAs 26 is dissolved without residue, and the melted Ga gets to the Al+Si 25 and dissolves the latter.

In this condition, the boat is rotated 180° by turning the moving tube 32. The Ga, Al melt now is in contact with the substrate 28 for saturation. Through the gap 29 can escape, on the one hand, the Ga$_2$O produced by the baking-out of the Ga 27, and on the other hand, the Ga, Al melt which is not drawn into the gap after being tilted on the GaAs substrates 28. After the temperature and solution equilibrium has occurred, the (Ga, Al) As layer is deposited on the substrate remaining after the melt is saturated.

What is claimed is:

1. An apparatus for use in the manufacture of epitaxial Ga$_{1-x}$Al$_x$As:Si by liquid phase epitaxy comprising:
   a first horizontally disposed graphite boat having a substantially flat lower surface, a substantially flat upper surface having at least one depression therein, adapted to receive Al, and rims at each end of said boat projecting a substantially identical pre-determined distance vertically above said upper surface;
   a second horizontally disposed graphite boat having a substantially flat lower surface, a substantially flat upper surface having at least one depression therein and rims at each end of said second boat projecting a substantially identical pre-determined distance vertically above said upper surface thereof;
   said second boat being stacked upon said first boat such that the lower surface of said second boat is in contact with the projecting rims of said first boat and defines an open longitudinal recess with the upper surface of said first boat for receiving Ga, at least one GaAs substrate wafer and Si on the surface of said wafer.

2. An apparatus for use in the manufacture of epitaxial Ga$_{1-x}$Al$_x$As:Si by liquid phase epitaxy comprising:
   a horizontally disposed graphite boat having a substantially flat lower surface, a substantially flat upper surface and rims at each end of said boat projecting a substantially identical pre-determined distance vertically above said upper surface;
   a graphite composite part comprised of a horizontally disposed lower section, having substantially flat upper and lower surfaces and having at least one hole therein, the lower surface being in contact with the projecting rims of said boat and defining an open longitudinal recess with the upper surface of said boat for receiving Ga, at least one GaAs substrate wafer positioned below the hole in said lower section of said graphite part and Si on the surface of the wafer; a horizontally disposed upper section a pre-determined distance above said lower section having substantially flat upper and lower surfaces; and a slidable section adapted for axial movement between said upper and lower sections and having at least one hole therein adapted to receive Al and capable of being aligned with the hole in the lower section of said graphite section.

3. An apparatus for use in the manufacture of epitaxial Ga$_{1-x}$Al$_x$As:Si by liquid phase epitaxy comprising:
   a first graphite boat having a substantially flat lower surface and a substantially flat upper surface having at least one set of stepped recesses therein for receiving Al and Si in a lower recess; a GaAs wafer fragment in a next vertical recess; and Ga in a next vertical recess;
   a second graphite boat having a substantially flat lower surface and a substantially flat upper surface having at least one set of stepped recesses therein, said second boat being affixed a pre-determined vertical distance above said first boat such that the upper surface of said first boat and the lower surface of said second boat define an open longitudinal recess for receiving at least one GaAs substrate wafer positioned above the stepped recesses in the upper surface of said first boat.

* * * * *